(12) United States Patent
Shappir et al.

(10) Patent No.: US 9,996,417 B2
(45) Date of Patent: Jun. 12, 2018

(54) DATA RECOVERY IN MEMORY HAVING MULTIPLE FAILURE MODES

(71) Applicant: Apple Inc., Cupertino, CA (US)

(72) Inventors: Assaf Shappir, Ganey Tikva (IL); Etai Zaltsman, Ramat Hasharon (IL); Guy Ben-Yehuda, Hod Hasharon (IL)

(73) Assignee: Apple Inc., Cupertino, CA (US)

( * ) Notice: Subject to any disclaimer, the term of this patent is extended or adjusted under 35 U.S.C. 154(b) by 128 days.

(21) Appl. No.: 15/096,303

(22) Filed: Apr. 12, 2016

(65) Prior Publication Data

US 2017/0293527 A1 Oct. 12, 2017

(51) Int. Cl.
*G06F 11/10* (2006.01)
*G11C 29/52* (2006.01)

(52) U.S. Cl.
CPC .......... *G06F 11/1072* (2013.01); *G11C 29/52* (2013.01)

(58) Field of Classification Search
CPC ............. G06F 11/1068; G06F 11/1072; G06F 11/1076; G06F 11/0751; G06F 11/079; G06F 11/1016; G06F 11/1044; G11C 29/78; G11C 29/785; G11C 29/50; G11C 29/52; G11C 29/10; G11C 29/38
See application file for complete search history.

(56) References Cited

U.S. PATENT DOCUMENTS

| | | |
|---|---|---|
| 4,841,482 A | 6/1989 | Kreifels |
| 5,181,025 A | 1/1993 | Ferguson et al. |
| 5,331,594 A | 7/1994 | Hotta |
| 5,372,712 A | 12/1994 | Petit |
| 5,428,621 A | 6/1995 | Mehrotra et al. |
| 5,440,516 A | 8/1995 | Slemmer |
| 5,581,509 A | 12/1996 | Golla et al. |
| 5,602,778 A | 2/1997 | Futatsuya et al. |
| 5,606,527 A | 2/1997 | Kwack et al. |
| 5,684,747 A | 11/1997 | Urai |
| 5,748,545 A | 5/1998 | Lee et al. |
| 5,796,653 A | 8/1998 | Gaultier |
| 5,847,995 A | 12/1998 | Kobayashi et al. |
| 5,898,637 A | 4/1999 | Lakhani et al. |

(Continued)

OTHER PUBLICATIONS

U.S. Appl. No. 14/572,818 Office Action dated Oct. 29, 2015.

(Continued)

*Primary Examiner* — Nadeem Iqbal
(74) *Attorney, Agent, or Firm* — D. Kligler IP Services Ltd.

(57) ABSTRACT

A controller includes an interface and a processor. The interface is configured to communicate with a memory including multiple memory cells organized in at least two sections each including multiple sets of word lines (WLs), wherein in a first failure mode multiple WLs fail in a single section, and in a second failure mode a WL fails in multiple sections. The processor is configured to assign multiple cell-groups of the memory cells to a parity-group, such that (i) no two cell-groups in the parity-group belong to a same WL, and (ii) no two cell-groups in the parity-group belong to adjacent WLs in a same section, and, upon detecting a failure to access a cell-group in the parity-group, due to either the first or second failure modes but not both failure modes occurring simultaneously, to recover the data stored in the cell-group using one or more remaining cell-groups in the parity-group.

20 Claims, 4 Drawing Sheets

(56) References Cited

U.S. PATENT DOCUMENTS

| | | | |
|---|---|---|---|
| 6,031,772 | A | 2/2000 | Nagatomo |
| 6,545,910 | B2 | 4/2003 | Byeon et al. |
| 6,650,585 | B2 | 11/2003 | Chevallier |
| 6,707,078 | B1 | 3/2004 | Shiraiwa et al. |
| 6,813,183 | B2 | 11/2004 | Chevallier |
| 7,089,460 | B2 | 8/2006 | Fu |
| 7,212,454 | B2 | 5/2007 | Kleveland et al. |
| 7,319,623 | B1 | 1/2008 | Yuan et al. |
| 7,440,347 | B1 | 10/2008 | Vogelsang |
| 7,463,529 | B2 | 12/2008 | Matsubara |
| 8,305,807 | B2 | 11/2012 | Shah et al. |
| 8,379,454 | B2 | 2/2013 | Kochar et al. |
| 8,432,732 | B2 | 4/2013 | Li et al. |
| 8,514,630 | B2 | 8/2013 | Huynh et al. |
| 8,645,749 | B2 | 2/2014 | Reche |
| 8,730,722 | B2 | 5/2014 | Koh et al. |
| 8,732,557 | B2 | 5/2014 | Ratnam et al. |
| 8,767,459 | B1 | 7/2014 | Kasorla et al. |
| 8,775,901 | B2 | 7/2014 | Sharon et al. |
| 8,902,657 | B2 | 12/2014 | Iwai et al. |
| 9,021,343 | B1 | 4/2015 | Hu |
| 9,092,363 | B2 * | 7/2015 | Avila .................. G11C 16/349 |
| 9,177,610 | B2 * | 11/2015 | D'Abreu ............. G06F 13/1668 |
| 9,330,783 | B1 | 5/2016 | Rotbard et al. |
| 9,390,809 | B1 | 7/2016 | Shur et al. |
| 9,406,346 | B2 * | 8/2016 | D'Abreu ............. G06F 13/1668 |
| 2002/0174295 | A1 | 11/2002 | Ulrich et al. |
| 2008/0052446 | A1 | 2/2008 | Lasser et al. |
| 2009/0225607 | A1 | 9/2009 | Chen et al. |
| 2010/0128525 | A1 | 5/2010 | Mokhlesi |
| 2010/0329052 | A1 | 12/2010 | Chen et al. |
| 2011/0066793 | A1 | 3/2011 | Burd |
| 2012/0159281 | A1 * | 6/2012 | Shalvi ................. G06F 11/1044 714/755 |
| 2013/0268724 | A1 | 10/2013 | Seo et al. |
| 2014/0047291 | A1 * | 2/2014 | Shalvi ................. G06F 11/1044 714/723 |
| 2014/0075259 | A1 * | 3/2014 | Tam .................... G06F 11/1044 714/747 |
| 2014/0189438 | A1 | 7/2014 | Arbel et al. |
| 2014/0254264 | A1 | 9/2014 | Dutta et al. |
| 2014/0269071 | A1 | 9/2014 | Pandya et al. |
| 2014/0321202 | A1 | 10/2014 | Yang et al. |

OTHER PUBLICATIONS

Srinivasan et al., U.S. Appl. No. 14/975,784 dated Dec. 20, 2015.
U.S. Appl. No. 14/975,784 Office Action dated Jul. 6, 2016.
U.S. Appl. No. 14/617,961 Office Action dated Feb. 25, 2016.

* cited by examiner

DATA RECOVERY IN MEMORY HAVING MULTIPLE FAILURE MODES

TECHNICAL FIELD

Embodiments described herein relate generally to data storage, and particularly to methods and systems for recovering data in memory having multiple failure modes.

BACKGROUND

In various storage systems, a controller stores data in multiple memory devices using a redundant storage scheme supporting data recovery, such as, for example, a redundant array of independent disks (RAID) scheme. Methods for data recovery in multi-device storage systems are known in the art. For example, U.S. Pat. No. 8,645,749, whose disclosure is incorporated herein by reference, describes systems and methods for storing the firmware and other data of a flash memory controller, such as using a RAID configuration across multiple flash memory devices or portions of a single memory device. In various embodiments, the firmware and other data used by a controller, and error correction information, such as parity information for RAID configuration, may be stored across multiple flash memory devices, multiple planes of a multi-plane flash memory device, or across multiple blocks or pages of a single flash memory device. The controller may detect the failure of a memory device or a portion thereof, and reconstruct the firmware and/or other data from the other memory devices or portions thereof.

As another example, U.S. Pat. No. 9,021,343, whose disclosure is incorporated herein by reference, describes a data storage device that includes a non-volatile memory having a three-dimensional (3D) memory configuration. The data storage device may further include selection circuitry configured to select data for a parity operation in accordance with a parity scheme. The parity scheme may correspond to a string-based and group-based striping pattern.

SUMMARY

An embodiment that is described herein provides a controller that includes an interface and a processor. The interface is configured to communicate with a memory including multiple memory cells organized in at least two sections each including multiple sets of word lines (WLs), wherein in a first failure mode multiple WLs fail but only in a single section, and in a second failure mode a WL fails in multiple sections. The processor is configured to assign multiple cell-groups of the memory cells to a parity-group, such that (i) no two cell-groups in the parity-group belong to a same WL, and (ii) no two cell-groups in the parity-group belong to adjacent WLs in a same section, and, upon detecting a failure to access a cell-group in the parity-group, due to either the first failure mode or the second failure mode but not both the first and second failure modes simultaneously, to recover the data stored in the cell-group using one or more remaining cell-groups in the parity-group.

In some embodiments, the first failure mode occurs because of a WL-to-WL short, and the second failure mode occurs due to a leakage from a WL to a substrate on which the memory cells are disposed or due to a device selection failure. In other embodiments, the at least two sections include first and second memory planes on a same semiconductor die, and failing WLs in the first and second planes belong to different respective sets of WLs. In yet other embodiments, the parity-group includes a stripe in a redundant array of independent disks (RAID) storage scheme, and the processor is configured to recover the data in accordance with the RAID storage scheme.

In an embodiment, the memory cells include multi-level cells (MLC) storing multiple bits per cell, each of the multiple cell-groups stores multiple data pages of different respective bit-significance, and the processor is configured to assign the data pages of the different bit-significance to different respective parity-groups. In another embodiment, the data stored in a given cell-group of the parity-group is protected using an Error Correction Code (ECC), and the processor is configured to detect the failure by identifying a failure to decode the ECC. In yet another embodiment, the processor is configured to assign first and second cell-groups in corresponding blocks of the at least two sections, having a same block-index.

In some embodiments, the memory cells belong to multiple semiconductor dies, and the processor is configured to assign the multiple cell-groups in different respective semiconductor dies. In other embodiments, the processor is configured to assign the multiple cell-groups in accordance with a die-specific assignment pattern of cell-groups to parity-groups. In yet other embodiments, the memory cells are organized in a three-dimensional (3D) configuration in which each WL includes memory cells of multiple different strings, and the processor is configured to assign data pages of different strings to different respective parity-groups. In yet further other embodiments, the sets of WLs include memory blocks, the first failure mode causes the failure in all the WLs of a memory block in the single section, and the processor is configured to recover the entire memory block using data stored in one or more blocks of one or more other sections.

There is additionally provided, in accordance with an embodiment that is described herein a method that includes storing data in a memory including multiple memory cells organized in at least two sections each including multiple sets of word lines (WLs), wherein in a first failure mode multiple WLs fail but only in a single section, and in a second failure mode a WL fails in multiple sections. Multiple cell-groups of the memory cells are assigned to a parity-group, such that (i) no two cell-groups in the parity-group belong to a same WL, and (ii) no two cell-groups in the parity-group belong to adjacent WLs in a same section. Upon detecting a failure to access a cell-group in the parity-group, due to either the first failure mode or the second failure mode but not both the first and second failure modes simultaneously, the data stored in the cell-group is recovered using one or more remaining cell-groups in the parity-group.

These and other embodiments will be more fully understood from the following detailed description of the embodiments thereof, taken together with the drawings in which:

DETAILED DESCRIPTION OF EMBODIMENTS

Overview

Various storage systems comprise a controller that stores data in one or more memory devices. The memory devices comprise memory cells that are typically arranged in one or more arrays of rows and columns. A row of memory cells is also referred to as a word line (WL). In some types of memory devices, the memory cells are arranged in two or more sections or planes that share the same set of WLs. The memory devices typically support multi-plane write commands that write data to WLs in multiple planes in parallel, possibly in blocks of different respective indices.

The controller stores data to WLs in units that are referred to as data pages. In a multi-level cell (MLC) device, the controller may store multiple data pages to a given group of the memory cells. For example, in a 2 bits/cell device, a group of memory cells stores both a least significant bit (LSB) page and a most significant bit (MSB) page.

A defect in a memory device may cause the data stored in a cell-group that belongs to a given WL to be corrupted. A defect in the memory array may occur during manufacturing or during the device lifetime. The defect may cause failure during programming, during readout, or both. A similar failure may occur when the memory devices operate under extreme conditions of temperature, voltage, cycle count, etc., or when some specific material weakness occurs, e.g., due to manufacturing variability.

Embodiments that are disclosed herein provide improved methods and systems for data recovery in a storage system comprising one or more multi-plane memory devices, under certain failure conditions. The present disclosure refers mainly to two modes of WL failure that are assumed not to occur simultaneously, with high probability. In one failure mode a WL-to-WL short causes a failure in multiple WLs, but is predominantly confined to only a single plane. In the other failure mode only a single WL fails, due to a leakage from the WL to the substrate on which the memory cells are disposed, but the failure can affect one or more WLs operated in parallel in multiple planes. The same principle can be extended, for example to the block level, thus protecting a full block in one plane, or multiple block-subsets in multiple respective planes.

In the description that follows, a redundant array of independent disks (RAID) scheme is used for data recovery. We focus on a RAID scheme in which data pages are bitwise XORed to produce a redundancy or parity page. In alternative embodiments, other suitable RAID schemes or redundant storage schemes other than RAID can also be used. The proposed RAID schemes are designed to capture only failure events that are more likely to occur, thus providing high reliability with reduced storage space and costs.

In the disclosed embodiments, the controller implements the redundant storage scheme in parity-groups, also referred to as stripes. Each parity-group comprises a set of data pages, plus at least one redundancy or parity page that is calculated over the set of data pages. The different pages of a parity-group are stored in predefined cell-groups located in multiple WLs and multiple planes, so as to be resilient to the above-described failure modes.

The novel assignment of the data pages to the parity-groups ensures that, since only one of the data pages or the respective redundancy page is expected to fail at one time, the failing page can be recovered using the non-failing pages including the redundancy page. The novel assignment schemes are efficient in terms of the storage required for parity information compared to conventional RAID schemes.

Consider for example a 2 bit/cell device that comprises two planes. In principle, to overcome simultaneous occurrence of both the WL-to-WL and the WL-to-substrate failure modes, the controller would need to assign the data pages to eight different parity-groups, and store eight respective redundancy pages. In the disclosed techniques, however, under the assumption that the two failure modes do not occur simultaneously (with high probability), the number of parity-groups, and therefore the redundancy storage space, can be reduced significantly, as will be described below. The described assignment principles are also applicable to memory devices that store more than 2 bits per cell and/or having more than two planes. For example, in a MLC memory device that comprises four planes, using the disclosed embodiments reduces the number of parity-groups from sixteen to only eight.

In some embodiments, the controller assigns pages (data and redundancy) to a parity-group so that the parity-group does not contain pages in adjacent WLs of the same plane. In addition, the parity-group does not contain pages belonging to the same WL, not in the same plane and not in different planes. In this assignment method, pages of the same WL that may fail together in multiple planes will never be assigned to the same parity-group, and pages in neighboring WLs that may fail together in a given plane are also assigned to different parity-groups. In the two-plane die example above, the assignment scheme reduces the number of parity-groups from eight to only four. Note that data pages of different bit significance are also assigned to different parity-groups and can therefore be recovered independently.

The principle according to which pages that may fail together due to the structure of the device are assigned to different parity-groups is not limited to planar structures such as in two-dimensional (2D) devices. For example, in some embodiments, in a three-dimensional (3D) configuration, data pages on the same WL in different strings are assigned to different parity-groups.

In some embodiments, the stored data is protected using an Error Correction Code (ECC), and the controller first attempts to correct errors in a data page using the ECC. If ECC decoding fails, e.g., when identifying that the number of errors in a retrieved page exceeds the error correction capability of the ECC, the controller retrieves the remaining data pages and the redundancy page of the stripe to recover the failing page.

In some embodiments, the storage scheme is applied in each memory device separately. In other embodiments, the storage scheme extends across multiple memory devices. In addition, the pattern by which data pages are assigned to the parity-groups may differ from one memory device to another.

System Description

Figure 1:
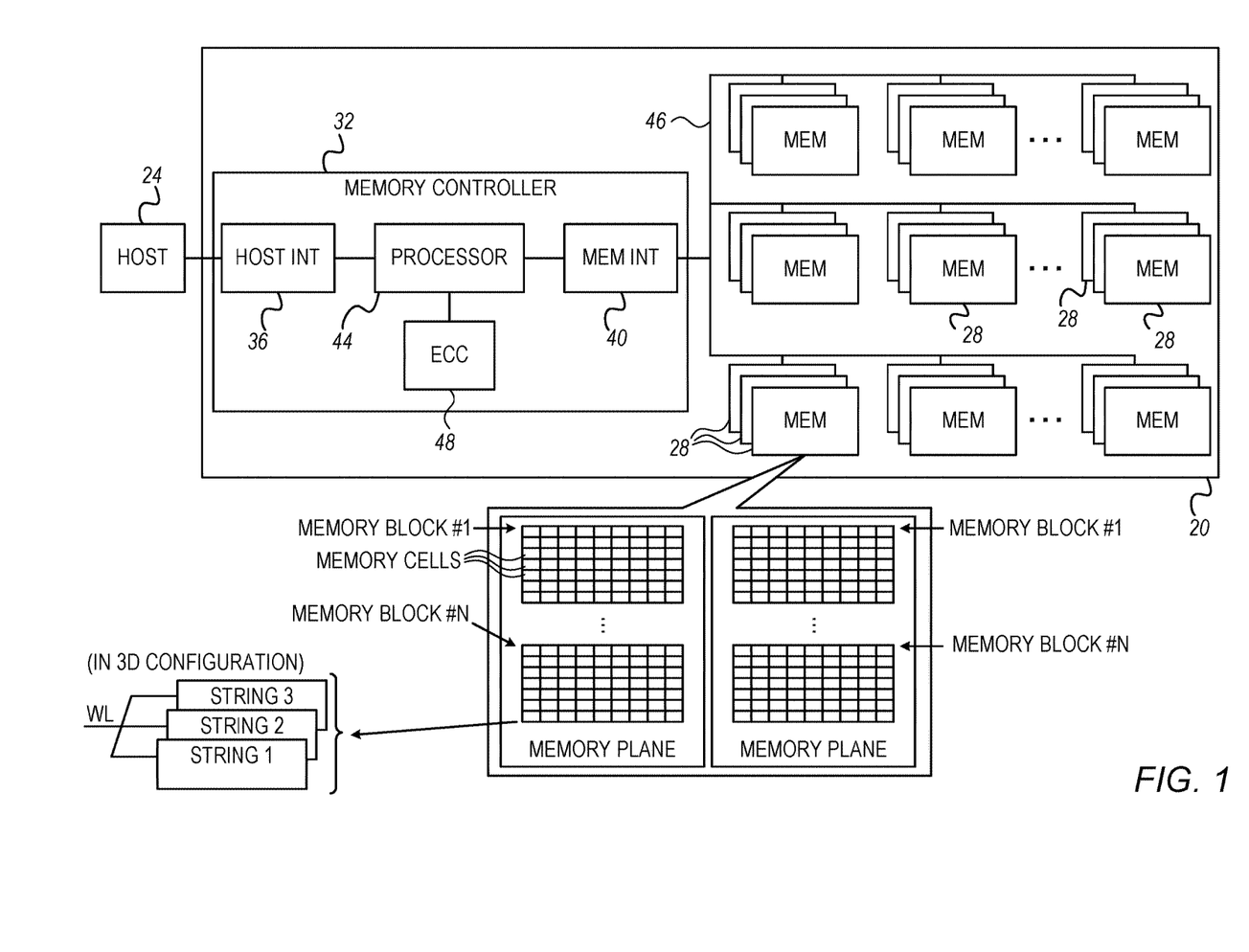
FIG. 1 is a block diagram that schematically illustrates a memory system, in accordance with an embodiment that is described herein.

FIG. 1 is a block diagram that schematically illustrates a multi-device memory system 20, in accordance with an embodiment that is described herein. System 20 accepts data for storage from a host 24 and stores it in memory, and retrieves data from memory and provides it to the host. In the present example, system comprises a Solid-State Disk (SSD) that stores data for a host computer. In alternative embodiments, however, system 20 may be used in any other suitable application and with any other suitable host, such as in computing devices, cellular phones or other communication terminals, removable memory modules, Secure Digital (SD) cards, Multi-Media Cards (MMC) and embedded MMC (eMMC), digital cameras, music and other media players and/or any other system or device in which data is stored and retrieved.

System 20 comprises multiple memory devices 28, each comprising multiple memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM), resistive RAM (RRAM or ReRAM), magnetic RAM (MRAM) and/or Dynamic RAM (DRAM) cells, can also be used.

In some embodiments, the memory cells of devices 28 comprise analog memory cell that hold a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values.

System 20 stores data in the memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

The memory cells are typically arranged in rows and columns. Typically, a given memory device comprises multiple erasure blocks (also referred to as memory blocks, or simply blocks, for brevity), i.e., groups of memory cells that are erased together. Data typically cannot be reprogrammed in-place, and memory blocks are therefore erased before being programmed with other data. Data is typically programmed to groups of memory cells, and retrieved from the groups of the memory cells in data units that are referred to as data pages, or simply pages, for brevity. In the example of FIG. 1, the memory cells are arranged in two memory planes that each comprises N memory blocks, indexed respectively with integer block indices 1. . . N. In some embodiments, the memory cells are arranged in a Three-Dimensional (3D) configuration. In such embodiments, each Word Line (WL) comprises memory cells of multiple different strings, as depicted at the bottom of FIG. 1.

In some embodiments, each page comprises an entire row of the array, also referred to as a word line. In alternative embodiments, each row (word line) can be divided into two or more pages. For example, in some devices each row is divided into two pages, one comprising the odd-order cells and the other comprising the even-order cells. In some embodiments, memory pages are sub-divided into sectors.

In some embodiments, a given memory die comprises multiple memory arrays that are referred to as planes, and it is possible to program multiple pages into multiple respective planes in parallel. Typically, failing word lines can cause failure to word lines within the planes of a given die, but not with the planes of other dies.

Each memory device 28 may comprise a packaged device or an unpackaged semiconductor chip or die. A typical SSD may comprise a number of memory devices, each having a capacity of 32 Gbytes, for example. Generally, however, system 20 may comprise any suitable number of memory devices of any desired type and size. Although the system configuration of FIG. 1 comprises multiple memory devices, some of the methods and systems described herein can also be used in systems having only a single memory device, e.g., a device having two or more planes.

System 20 comprises a memory controller 32, which accepts data from host 24 and stores it in memory devices 28, and retrieves data from the memory devices and provides it to the host. Memory controller 32 comprises a host interface 36 for communicating with host 24, a memory interface 40 for communicating with memory devices 28, and a processor 44 that processes the stored and retrieved data. In some embodiments, controller 32 encodes the stored data with an Error Correction Code (ECC). In these embodiments, controller 32 comprises an ECC unit 48, which encodes the data before stored in devices 28 and decodes the ECC of data retrieved from devices 28. The functions of processor 44 can be implemented, for example, using software running on the processor, using hardware (e.g., state machine or other logic), or using a combination of software and hardware elements.

Controller 32 communicates with memory devices 28 over a bus 46. Bus 46 may comprise any suitable link or bus such as a parallel bus or a serial bus, or a packet-based bus such as PCIe. Bus 46 may operate in accordance with any suitable standard or protocol, and at any suitable rate.

To apply a storage command to a given memory device, the controller sends the storage command to the memory device over bus 46. Types of storage commands include, for example, page write, page read and block erasure commands. The memory device executes the storage command internally, and sends back to the controller data and/or status information as specified by the command. The memory device typically indicates to the controller when the memory device is ready to accept subsequent commands. In some embodiments, system 20 supports storage commands that are applied to multiple memory devices in parallel.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and memory controller 32 may be fabricated on the same die, or on separate dies in the same device package.

Efficient Redundant Storage Schemes for Data Recovery

In various situations, a defect in the memory or a malfunction caused, for example, by memory wear-out, causes a WL failure that is beyond the correction capabilities of the ECC. A defect in the memory may cause a failure at erasure, programming, reading, or a combination of the three. For erasure and programming operations, the failure may be detectable as the operation is being executed, or alternatively only in a later reading operation. In the present disclosure and in the claims, the term "failure" refers to a storage failure that is unrecoverable by the ECC only.

In the description that follows we focus mainly on two failure modes. In one failure mode a WL fails in one or more planes due to a leakage from the WL to the substrate on which the memory cells are located in. The case in which WLs fail in two or more planes simultaneously typically occurs when accessing multiple planes in parallel, which is also referred to as a multi-plane operation. In the other failure mode, a short between WLs causes a failure in one or more neighboring WLs, but is confined to a single plane. The inventors have discovered that the probability of both failure modes occurring simultaneously is very low. As such, the two failure modes are considered orthogonal in nature, and the probability of their simultaneous occurrence is given by the product of the individual probabilities of the failing modes. By considering only one failure mode at a time, efficient schemes for data recovery can be derived, as will be described in detail below.

It should be noted that some failures events, although possible in principle, are much less likely to occur. Such rare events include failures affecting large memory areas such as an entire block, or a short between WLs that causes a failure in one or more neighboring WLs in multiple planes. The probability of such failures has been found to be considerably lower than those previously described, and therefore some memory systems may choose by design not support schemes to negate them, due to the associated incurred costs, power consumption, performance, capacity and so forth.

Figure 2A:
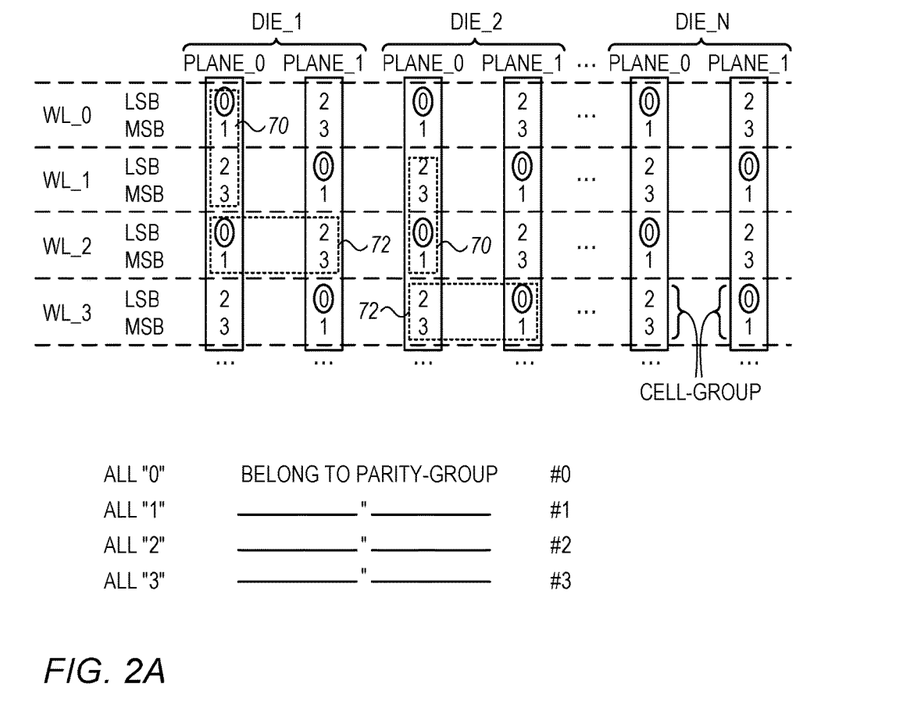
FIGS. 2A and 2B are diagrams that schematically illustrate schemes for assigning data pages to parity-groups, in accordance with embodiments that are described herein.
Figure 2B:
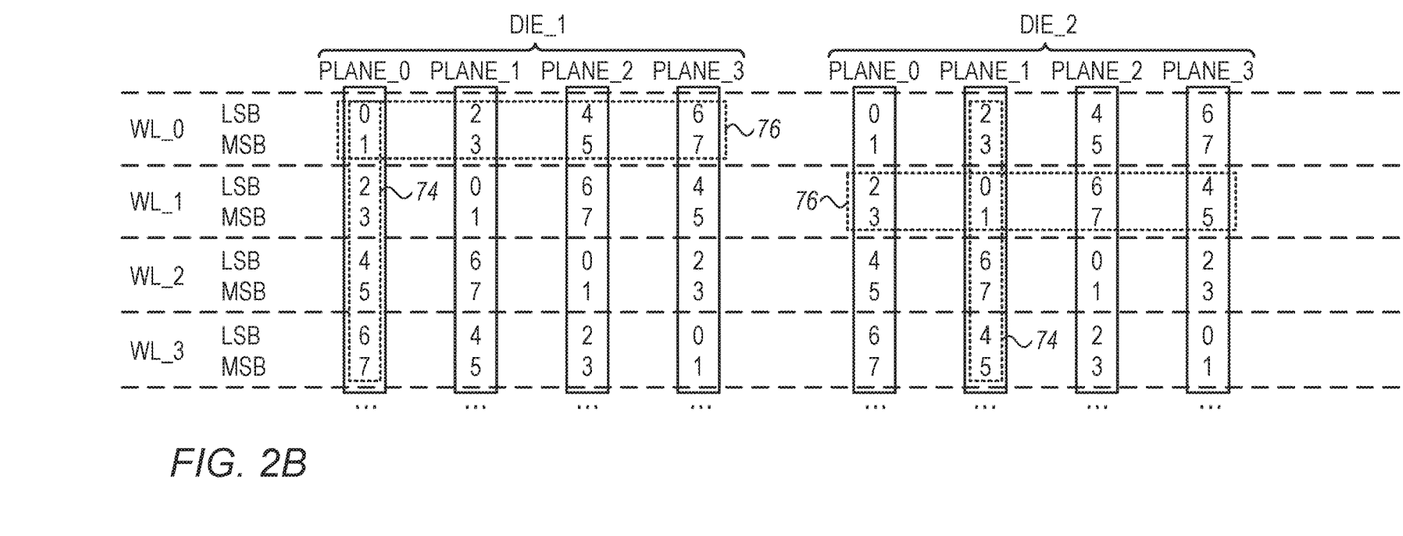

FIGS. 2A and 2B are diagrams that schematically illustrate schemes for assigning data pages to parity-groups, in accordance with embodiments that are described herein. FIGS. 2A and 2B refer to a storage system such as system 20 comprising multiple 2 bits/cell MLC memory devices 28. In the present example, each memory device is comprised in a separate semiconductor die.

The diagrams in FIGS. 2A and 2B refer to a multi-die memory system, wherein each die comprises multiple planes. The planes are depicted as rectangles denoted PLANE_0 and PLANE_1 in FIG. 2A and as rectangles denoted PLANE_0 . . . PLANE_3 in FIG. 2B. Each diagram depicts a set of four word lines WL_0 . . . WL_3 in which the memory cells store a least significant bit (LSB) page and a most significant bit (MSB) page. Although the figure depicts only four WLs, for the sake of clarity only, in practical systems each die typically comprises a larger number of WLs, such as, for example, 128 WLs per block and a few thousand blocks per die. Each of the dies comprises a separate set of WLs that are commonly accessed in parallel in multiple different planes of the die. Pages in different planes (possibly in different dies) that are contained in a given parity-group belong to blocks having the same block-index in the respective planes.

Referring now to FIG. 2A, dotted-line rectangles 70 refer to adjacent word lines (WL_0 and WL_1, or WL_1 and WL_2) of PLANE_0 of DIE_1 that may fail together due to a WL-to-WL short. Similarly, dotted-line rectangles 72 refer to a word line, which fails in both PLANE_0 and PLANE_1 due to a WL-to-substrate leakage. The failing WLs typically belong to two different blocks accessed in parallel during a multi-plane operation. The parallel operation may cause this simultaneous WL failure, for example, due to a physical defect in one of the blocks that causes both to fail.

In the present example, memory controller 32 carries out data recovery using a redundant array of independent disks (RAID) scheme in which data pages are assigned to four parity-groups. In FIG. 2A, the pages assigned to parity-group #0 are marked "0", the pages assigned to parity-group #1 are marked "1", the pages assigned to parity-group #2 are marked "2", and the pages assigned to parity-group #3 are marked "3".

In this example, parity-groups #0 and #2 are used for the recovery of LSB pages, and parity-groups #1 and #3 are used for the recovery of MSB pages. At the WL or memory-cells level (as opposed to the data-page level), the parity-groups can be viewed as joint parity-groups (#0,#1) and (#2,#3) that refer to even and odd WLs, respectively.

In the disclosed embodiments, parity-groups are defined so that a given parity-group does not contain pages (data or redundancy) of adjacent WLs in the same plane, and does not include pages of the same WL in multiple planes. Moreover, pages of different bit significance stored in a given cell-group are assigned to different respective parity-groups.

In the example of FIG. 2, the LSB and MSB pages of the even WLs of PLANE_0 and the odd WLs of PLANE_1 are assigned to parity-groups #0 and #1, respectively. Similarly, the LSB and MSB pages of the even WLs of PLANE_1 and the odd WLs of PLANE_0 are assigned to parity-groups #2 and #3, respectively.

When a short occurs, for example, between WL_0 and WL_1 in PLANE_0 but not in PLANE_1, the LSB (or MSB) pages of WL_0 and WL_1 can be recovered using remaining pages of parity-groups #0 and #2 (or #1 and #3), respectively. As another example, when WL_2 has a leakage to the substrate, which causes a failure to WL_2 in both planes, the LSB (or MSB) pages in PLANE_0 and PLANE_1 can be recovered using remaining pages of parity-groups #0 and #2 (or #1 and #3), respectively.

In some embodiments, the parity is calculated at a block level, e.g., bitwise Xoring the LSB pages of the even WLs within a block and over multiple blocks of the respective planes. The pattern by which cell-groups (or pages) are assigned to parity-groups typically repeats across the block WLs and among the different planes and dies. Alternatively, different assignment patterns may be used for different dies. In some embodiments, each die handles its own parity-groups for data recovery, independently of the other dies. In other embodiments, assuming that a failing WL in one die is unlikely to fail in other dies simultaneously, the parity-groups include cell-groups and pages of multiple dies, which reduces the storage space required for the redundancy data by a factor of N.

In FIG. 2B, the memory system comprises two dies, each comprising four planes PLANE_0 . . . PLANE_3. In this example, we assume that a WL-to-WL short may affect up to four consecutive WLs as depicted by a dotted-line rectangle 74, and that a WL-to-substrate leakage may cause a WL to fail in some or all of the four planes as depicted by a dotted-line rectangle 76. Since we assume that both failure modes are unlikely to occur simultaneously, only eight parity-groups #0 . . . #7 are required for data recovery, in this example. This scheme is much more efficient than assigning the cell-groups and data pages to thirty two parity-groups when assuming that the failure modes may occur simultaneously.

Figure 3:
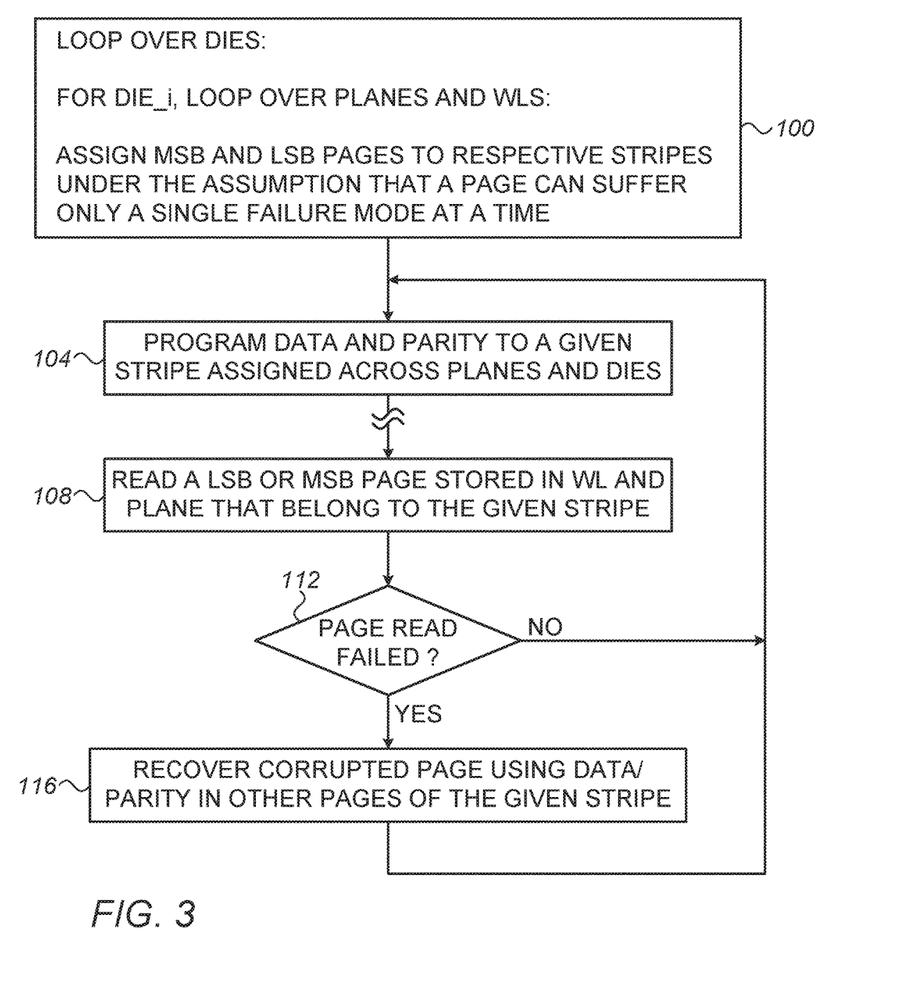
FIG. 3 is a flow chart that schematically illustrates a method for recovering a data page corrupted due to a single failure mode, in accordance with an embodiment that is described herein.

FIG. 3 is a flow chart that schematically illustrates a method for recovering a data page corrupted due to a single failure mode, in accordance with an embodiment that is described herein. The method is described with reference to the storage system in FIG. 1 and parity-groups as described in FIG. 2A above.

At an assignment step 100, the memory controller 32 loops over the system dies and the WLs thereof, and assigns data pages to stripes to be used later for data recovery. In this example, each stripe comprises 2N pages selected respectively from the 2N planes. In particular, LSB pages and MSB pages are assigned to different stripes.

At step 100, it is assumed that the data pages were previously partitioned to parity-groups under the assumption that the failure modes WL-to-WL short and WL-to-substrate leakage do not occur simultaneously. Example partitioning patterns that meet the single failure mode requirement are described, for example, in FIG. 2A above.

At a stripe programming step 104, the memory controller programs 2N−1 data pages plus a respective redundancy page in one of the stripes defined at step 100. The redundancy page is derived by bitwise XORing the 2N−1 data pages. In some embodiments, the memory controller writes the WLs of a block one at a time, e.g., sequentially. The memory controller holds a temporary parity, per parity-group, e.g., in a DRAM or a SRAM of the controller, and updates the temporary parity as the block programming progresses. When concluding programming the block, the final parity is stored for the relevant stripe. At a retrieval step 108, which may be executed at a later time, the memory controller reads a LSB or MSB page of some WL that belongs to a previously programmed stripe.

At a failure checking step 112, the memory controller checks whether the read operation at step 108 has failed. The memory controller may use any suitable method for detecting a page read failure, such as identifying that the number of errors in the retrieved page is beyond the error correction capabilities of the underlying ECC. If at step 112 the read operation has succeeded, the memory controller loops back to step 104 to program subsequent stripes. Alternatively, the memory controller loops back to step 108 (not shown in the figure) to read subsequent pages.

If at step 112 the read operation has failed, the memory controller proceeds to a recovery step 116, in which the controller reads the other pages of the stripe, in accordance with the stripe assignment of step 100, and uses these other pages, which are assumed to have been retrieved correctly, to recover the corrupted page. The method then loops back to step 104 or 108, as described above.

The embodiments described above are given by way of example, and other suitable embodiments can also be used. For example, the pattern of assigning pages to parity-groups as depicted in FIGS. 2A and 2B are example patterns, and other suitable patterns can also be used. For example, another pattern in FIG. 2B can be derived by taking a permutation of the planes, e.g., using the pattern depicted in PLANE_0 for PLANE_1, and vice versa.

Alternative Assignment Schemes for 2D Configurations

In the following description we present several example RAID schemes for efficient assignment of data pages to parity-groups. The assignment schemes support recovery from a WL-to-WL short failure and from a WL-to-substrate leakage failure that do not occur simultaneously, as described above.

The RAID schemes are depicted in tables in which the rows refer to even and odd WLs and the columns to planes such as P0 and P1. Within a given WL (even or odd) data pages of different bit-significance are denoted L and U for respective LSB pages and MSB pages, in a planar MLC device. Similarly, data pages of lower, middle and upper bit-significance in a planar TLC device are denoted L, M and U, respectively. The tables depict RAID schemes in a single die, but can be extended to multiple dies, as described above.

Table 1, depicts two schemes for a 2-plane planar MLC device. In Scheme 1 L-pages of even WLs are grouped with U-pages of odd WLs in the other plane, whereas in Scheme 2, L-pages of even WLs are grouped with L-pages of odd WLs in the other plane.

TABLE 1

Planar MLC, 2-planes

|  | Scheme 1 | | Scheme 2 | |
| --- | --- | --- | --- | --- |
|  | P0 | P1 | P0 | P1 |
| WL-even, L | 0 | 3 | 0 | 2 |
| WL-even, U | 1 | 2 | 1 | 3 |
| WL-odd, L | 2 | 1 | 2 | 0 |
| WL-odd, U | 3 | 0 | 3 | 1 |
| WL-even, L | 0 | 3 | 0 | 2 |
| WL-even, U | 1 | 2 | 1 | 3 |
| WL-odd, L | 2 | 1 | 2 | 0 |
| WL-odd, U | 3 | 0 | 3 | 1 |

Tables 2 and 3 depict RAID schemes for a 4-plane planar MLC device. As seen in the tables, in Scheme 3 data pages in P0 and P2 and in P1 and P3 are grouped together in respective stripes, whereas in Scheme 4, data pages in P0 and P1 and in P2 and P3 are grouped together in respective stripes.

TABLE 2

Planar MLC, 4-planes

|  | Scheme 3 | | | |
| --- | --- | --- | --- | --- |
|  | P0 | P1 | P2 | P3 |
| WL-even, L | 0 | 1 | 4 | 5 |
| WL-even, U | 2 | 3 | 6 | 7 |
| WL-odd, L | 4 | 5 | 0 | 1 |
| WL-odd, U | 6 | 7 | 2 | 3 |
| WL-even, L | 0 | 1 | 4 | 5 |
| WL-even, U | 2 | 3 | 6 | 7 |
| WL-odd, L | 4 | 5 | 0 | 1 |
| WL-odd, U | 6 | 7 | 2 | 3 |

TABLE 3

Another planar MLC, 4-planes

Scheme 4

| | P0 | P1 | P2 | P3 |
|---|---|---|---|---|
| WL-even, L | 0 | 2 | 4 | 6 |
| WL-even, U | 1 | 3 | 5 | 7 |
| WL-odd, L | 2 | 0 | 6 | 4 |
| WL-odd, U | 3 | 1 | 7 | 5 |
| WL-even, L | 4 | 6 | 0 | 2 |
| WL-even, U | 5 | 7 | 1 | 3 |
| WL-odd, L | 6 | 5 | 2 | 0 |
| WL-odd, U | 7 | 4 | 3 | 1 |

Table 4 depicts two RAID schemes for a 2-plane planar TLC device, and each of Tables 5 and 6 depicts a RAID scheme for a 4-plane planar TLC device.

TABLE 4 planar TLC, 2-planes

| | Scheme 5 | | Scheme 6 | |
|---|---|---|---|---|
| | P0 | P1 | P0 | P1 |
| WL-even, L | 0 | 5 | 0 | 3 |
| WL-even, M | 1 | 4 | 1 | 4 |
| WL-even, U | 2 | 3 | 2 | 5 |
| WL-odd, L | 3 | 2 | 3 | 0 |
| WL-odd, M | 4 | 1 | 4 | 1 |
| WL-odd, U | 5 | 0 | 5 | 2 |
| WL-even, L | 0 | 5 | 0 | 3 |
| WL-even, M | 1 | 4 | 1 | 4 |
| WL-even, U | 2 | 3 | 2 | 5 |
| WL-odd, L | 3 | 2 | 3 | 0 |
| WL-odd, M | 4 | 1 | 4 | 1 |
| WL-odd, U | 5 | 0 | 5 | 2 |

TABLE 5

Planar TLC, 4-planes

Scheme 7

| | P0 | P1 | P2 | P3 |
|---|---|---|---|---|
| WL-even, L | 0 | 1 | 6 | 7 |
| WL-even, M | 2 | 3 | 8 | 9 |
| WL-even, U | 4 | 5 | 10 | 11 |
| WL-odd, L | 6 | 7 | 0 | 1 |
| WL-odd, M | 8 | 9 | 2 | 3 |
| WL-odd, U | 10 | 11 | 4 | 5 |
| WL-even, L | 0 | 1 | 6 | 7 |
| WL-even, M | 2 | 3 | 8 | 9 |
| WL-even, U | 4 | 5 | 10 | 11 |
| WL-odd, L | 6 | 7 | 0 | 1 |
| WL-odd, M | 8 | 9 | 2 | 3 |
| WL-odd, U | 10 | 11 | 4 | 5 |

TABLE 6

Another planar TLC, 4-planes

Scheme 8

| | P0 | P1 | P2 | P3 |
|---|---|---|---|---|
| WL-even, L | 0 | 6 | 3 | 9 |
| WL-even, M | 1 | 7 | 4 | 10 |
| WL-even, U | 2 | 8 | 5 | 11 |
| WL-odd, L | 3 | 9 | 0 | 6 |

TABLE 6-continued

Another planar TLC, 4-planes

Scheme 8

| | P0 | P1 | P2 | P3 |
|---|---|---|---|---|
| WL-odd, M | 4 | 10 | 1 | 7 |
| WL-odd, U | 5 | 11 | 2 | 8 |
| WL-even, L | 0 | 6 | 3 | 9 |
| WL-even, M | 1 | 7 | 4 | 10 |
| WL-even, U | 2 | 8 | 5 | 11 |
| WL-odd, L | 3 | 9 | 0 | 6 |
| WL-odd, M | 4 | 10 | 1 | 7 |
| WL-odd, U | 5 | 11 | 2 | 8 |

Extension to 3D Configurations

The embodiments described above refer mainly to memory devices having a 2D configuration. The disclosed techniques, however, are also applicable to devices having a 3D configuration as will be described below. In some embodiments, the memory cells are arranged in multiple strings in a memory device having a 3D configuration. In such embodiments, each WL comprises memory cells from multiple strings. In the description that follows we refer mainly to a 3D configuration with four strings. In alternative embodiments, however, any other suitable number of strings can also be used.

Similarly to MLC devices, a 3D device may operate in various storage-capacity modes such as SLC, MLC or TLC, i.e., storing one, two or three bits per cell, respectively. Alternatively, the 3D device may be configured to store more than three bits per cell.

In a 3D device, a WL-to-WL short may cause a failure in multiple strings. For example, in a 3D TLC die having four strings, a WL-to-WL short is likely to cause a failure in 24 pages within a plane (2 WLs×4 strings×3 pages). Similarly, a WL-to-substrate leakage in a 3D TLC two-plane die will also cause a failure in 24 pages (4 strings×3 pages×2 planes.)

By assuming, similarly to the MLC case, that the WL-to-WL and WL-to-substrate failure modes are unlikely to occur simultaneously, efficient RAID schemes can be designed as depicted in the example schemes below. For example, in the 3D TLC example above, only 24 parity-groups are required rather than 48 in a naïve scheme (2 WLs×4 strings×3 pages×2 planes.)

Tables 7 and 8 below, depict RAID schemes for a 3D MLC device having four strings and two or four planes, respectively. In the tables below S0 . . . S3 denote the four strings.

TABLE 7

3D MLC, 2-planes and 4-strings

Scheme 9

| | P0 | P1 |
|---|---|---|
| WL-even, L, S0 | 0 | 8 |
| WL-even, U, S0 | 1 | 9 |
| WL-even, L, S1 | 2 | 10 |
| WL-even, U, S1 | 3 | 11 |
| WL-even, L, S2 | 4 | 12 |
| WL-even, U, S2 | 5 | 13 |
| WL-even, L, S3 | 6 | 14 |
| WL-even, U, S3 | 7 | 15 |
| WL-odd, L, S0 | 8 | 0 |
| WL-odd, U, S0 | 9 | 1 |

TABLE 7-continued

3D MLC, 2-planes and 4-strings

|  | Scheme 9 | |
| --- | --- | --- |
|  | P0 | P1 |
| WL-odd, L, S1 | 10 | 2 |
| WL-odd, U, S1 | 11 | 3 |
| WL-odd, L, S2 | 12 | 4 |
| WL-odd, U, S2 | 13 | 5 |
| WL-odd, L, S3 | 14 | 6 |
| WL-odd, U, S3 | 15 | 7 |

TABLE 8

3D MLC, 4-planes and 4-strings

|  | Scheme 10 | | | |
| --- | --- | --- | --- | --- |
|  | P0 | P1 | P2 | P3 |
| WL-even, L, S0 | 0 | 16 | 8 | 24 |
| WL-even, U, S0 | 1 | 17 | 9 | 25 |
| WL-even, L, S1 | 2 | 18 | 10 | 26 |
| WL-even, U, S1 | 3 | 19 | 11 | 27 |
| WL-even, L, S2 | 4 | 20 | 12 | 28 |
| WL-even, U, S2 | 5 | 21 | 13 | 29 |
| WL-even, L, S3 | 6 | 22 | 14 | 30 |
| WL-even, U, S3 | 7 | 23 | 15 | 31 |
| WL-odd, L, S0 | 8 | 24 | 0 | 16 |
| WL-odd, U, S0 | 9 | 25 | 1 | 17 |
| WL-odd, L, S1 | 10 | 26 | 2 | 18 |
| WL-odd, U, S1 | 11 | 27 | 3 | 19 |
| WL-odd, L, S2 | 12 | 28 | 4 | 20 |
| WL-odd, U, S2 | 13 | 29 | 5 | 21 |
| WL-odd, L, S3 | 14 | 30 | 6 | 22 |
| WL-odd, U, S3 | 15 | 31 | 7 | 23 |

Tables 9 and 10 below, depict RAID schemes for a 3D TLC device having four strings and two or four planes, respectively.

TABLE 9

3D TLC, 2-planes and 4-strings

|  | Scheme 11 | |
| --- | --- | --- |
|  | P0 | P1 |
| WL-even, L, S0 | 0 | 12 |
| WL-even, M, S0 | 1 | 13 |
| WL-even, U, S0 | 2 | 14 |
| WL-even, L, S1 | 3 | 15 |
| WL-even, M, S1 | 4 | 16 |
| WL-even, U, S1 | 5 | 17 |
| WL-even, L, S2 | 6 | 18 |
| WL-even, M, S2 | 7 | 19 |
| WL-even, U, S2 | 8 | 20 |
| WL-even, L, S3 | 9 | 21 |
| WL-even, M, S3 | 10 | 22 |
| WL-even, U, S3 | 11 | 23 |
| WL-odd, L, S0 | 12 | 0 |
| WL-odd, M, S0 | 13 | 1 |
| WL-odd, U, S0 | 14 | 2 |
| WL-odd, L, S1 | 15 | 3 |
| WL-odd, M, S1 | 16 | 4 |
| WL-odd, U, S1 | 17 | 5 |
| WL-odd, L, S2 | 18 | 6 |
| WL-odd, M, S2 | 19 | 7 |
| WL-odd, U, S2 | 20 | 8 |
| WL-odd, L, S3 | 21 | 9 |
| WL-odd, M, S3 | 22 | 10 |
| WL-odd, U, S3 | 23 | 11 |

TABLE 10

3D TLC, 4-planes and 4-strings

|  | Scheme 12 | | | |
| --- | --- | --- | --- | --- |
|  | P0 | P1 | P2 | P3 |
| WL-even, L, S0 | 0 | 24 | 12 | 36 |
| WL-even, M, S0 | 1 | 25 | 13 | 37 |
| WL-even, U, S0 | 2 | 26 | 14 | 38 |
| WL-even, L, S1 | 3 | 27 | 15 | 39 |
| WL-even, M, S1 | 4 | 28 | 16 | 40 |
| WL-even, U, S1 | 5 | 29 | 17 | 41 |
| WL-even, L, S2 | 6 | 30 | 18 | 42 |
| WL-even, M, S2 | 7 | 31 | 19 | 43 |
| WL-even, U, S2 | 8 | 32 | 20 | 44 |
| WL-even, L, S3 | 9 | 33 | 21 | 45 |
| WL-even, M, S3 | 10 | 34 | 22 | 46 |
| WL-even, U, S3 | 11 | 35 | 23 | 47 |
| WL-odd, L, S0 | 12 | 36 | 0 | 24 |
| WL-odd, M, S0 | 13 | 37 | 1 | 25 |
| WL-odd, U, S0 | 14 | 38 | 2 | 26 |
| WL-odd, L, S1 | 15 | 39 | 3 | 27 |
| WL-odd, M, S1 | 16 | 40 | 4 | 28 |
| WL-odd, U, S1 | 17 | 41 | 5 | 29 |
| WL-odd, L, S2 | 18 | 42 | 6 | 30 |
| WL-odd, M, S2 | 19 | 43 | 7 | 31 |
| WL-odd, U, S2 | 20 | 44 | 8 | 32 |
| WL-odd, L, S3 | 21 | 45 | 9 | 33 |
| WL-odd, M, S3 | 22 | 46 | 10 | 34 |
| WL-odd, U, S3 | 23 | 47 | 11 | 35 |

Full Block and Full String Protection

In another embodiment, the system may be designed to reconstruct data of a full block that fails. In this embodiment, in a first failing mode all the WLs of a block in a single plane may fail simultaneously, e.g., because of a device selection failure. In a second mode of failure, one WL may fail in two or more planes, as described above. Table 11 depicts a RAID scheme that supports recovering all failing WLs (128 WLs in this example) of a block in one plane, or recovering a single WL (or up to 64 WLs in this example) across two planes.

TABLE 11

Block protection, MLC, 2-planes

|  | Scheme 13 | |
| --- | --- | --- |
|  | P0 | P1 |
| WL-even, L | 0 | 2 |
| WL-even, U | 1 | 3 |
| WL-odd, L | 2 | 0 |
| WL-odd, U | 3 | 1 |
| WL-even, L | 4 | 6 |
| WL-even, U | 5 | 7 |
| WL-odd, L | 6 | 4 |
| WL-odd, U | 7 | 5 |
| WL-even, L | 8 | 10 |
| WL-even, U | 9 | 11 |
| WL-odd, L | 10 | 8 |
| WL-odd, U | 11 | 9 |
| WL-even, L | 12 | 14 |
| WL-even, U | 13 | 15 |
| WL-odd, L | 14 | 12 |
| WL-odd, U | 15 | 13 |
| . . . | . . . | . . . |
| WL-odd, U |  | 255 |

Utilizing the above method, one can gain the capability to reconstruct a full block in one plane or parts of a block (half, one quarter or other), across planes. According to this scheme, a failing WL can be recovered using parity data stored in adjacent WLs. For example, in the scheme of Table 11, data pages in even WLs can be reconstructed using the data pages of odd WLs in the other plane. As such, the scheme in Table 11 can protect all even (or odd) WLs failing in both planes. This can enable parts of blocks to continue operating without failure, while the rest of the block is unable to reliably store data.

In a 3D device, a similar approach can be used for protecting full strings. For example, Table 12 depicts a RAID scheme for protecting full strings in a 3D MLC device having four planes. For example, in plane P0, string S0 is assigned parity-groups 0,1,2,3, . . . written in bold. In this example there are 48 WLs, with four strings per WL. Since each string holds 48 WLs×2 pages, 96 parity-groups are required for protecting a full string. The scheme reuses 32 parity-groups to protect a single WL, i.e., all four strings, two pages (of the MLC device) across the four planes.

TABLE 12

String protection, 3D MLC, 4-planes and 4- strings

| | Scheme 14 | | | |
|---|---|---|---|---|
| | P0 | P1 | P2 | P3 |
| WL-even, L, S0 | 0 | 8 | 16 | 24 |
| WL-even, U, S0 | 1 | 9 | 17 | 25 |
| WL-even, L, S1 | 2 | 10 | 18 | 26 |
| WL-even, U, S1 | 3 | 11 | 19 | 27 |
| WL-even, L, S2 | 4 | 12 | 20 | 28 |
| WL-even, U, S2 | 5 | 13 | 21 | 29 |
| WL-even, L, S3 | 6 | 14 | 22 | 30 |
| WL-even, U, S3 | 7 | 15 | 23 | 31 |
| WL-odd, L, S0 | 2 | | | |
| WL-odd, U, S0 | 3 | | | |
| WL-odd, L, S1 | 4 | | | |
| WL-odd, U, S1 | 5 | | | |
| WL-odd, L, S2 | 6 | | | |
| WL-odd, U, S2 | 7 | | | |
| WL-odd, L, S3 | 8 | | | |
| WL-odd, U, S3 | 9 | | | |
| even, L, S0-WL | 4 | | | |
| even, U, S0-WL | 5 | | | |
| even, L, S1-WL | 6 | | | |
| even, U, S1-WL | 7 | | | |
| even, L, S2-WL | 8 | | | |
| even, U, S2-WL | 9 | | | |
| even, L, S3-WL | 10 | | | |
| even, U, S3-WL | 11 | | | |
| WL-odd, L, S0 | 6 | | | |
| WL-odd, U, S0 | 7 | | | |
| . . . | | | | |
| | 94 | | | |
| | 95 | | | |
| . . . | | | | |

Although the embodiments described herein mainly address WL failures in memory devices of NAND technology, the methods and systems described herein can also be used in other applications, such as in using multiple physical cell layers in a stacked cross bar memory array, or even in using multiple platters in a hard disk drive (HDD) array.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller, comprising:
an interface, which is configured to communicate with a multi-plane memory comprising:
multiple memory cells organized in at least two different memory planes that are accessible in parallel; and
multiple word lines (WLs), wherein each WL traverses the different memory planes and is connected to respective cell-groups of the memory cells in the different memory planes,
wherein in a first failure mode, two or more cell-groups belonging to different WLs fail but only in a single memory plane, and wherein in a second failure mode, a plurality of cell-groups belonging to a single WL fail in multiple memory planes; and
a processor, which is configured to assign multiple cell-groups of the memory cells to a parity-group, such that (i) no two cell-groups in the parity-group belong to a same WL, and (ii) no two cell-groups in the parity-group belong to adjacent WLs in a same memory plane,
wherein the processor is further configured to, upon detecting a failure to access a cell-group in the parity-group due to either the first failure mode or the second failure mode but not both the first and second failure modes simultaneously, recover data stored in the cell-group using one or more remaining cell-groups in the parity-group.

2. The controller according to claim 1, wherein the first failure mode occurs because of a WL-to-WL short, and the second failure mode occurs due to a leakage from the WL to a substrate on which the memory cells are disposed or due to a device selection failure.

3. The controller according to claim 1, wherein the at least two memory planes comprise first and second memory planes on a same semiconductor die, wherein failing WLs in the first and second memory planes belong to different respective sets of WLs.

4. The controller according to claim 1, wherein the parity-group comprises a stripe in a redundant array of independent disks (RAID) storage scheme, wherein the processor is configured to recover the data in accordance with the RAID storage scheme.

5. The controller according to claim 1, wherein the memory cells comprise multi-level cells (MLC) storing multiple bits per cell, wherein each of the multiple cell-groups stores multiple data pages of different respective bit-significance, wherein the processor is configured to assign the data pages of the different bit-significance to different respective parity-groups.

6. The controller according to claim 1, wherein the data stored in a given cell-group of the parity-group is protected using an Error Correction Code (ECC), and wherein the processor is configured to detect the failure by identifying a failure to decode the ECC.

7. The controller according to claim 1, wherein the memory cells in each memory plane are comprised in multiple different memory blocks identified by respective block-indices, and wherein the processor is configured to assign first and second cell-groups in corresponding memory blocks of the at least two memory planes, having a same block-index.

8. The controller according to claim 1, wherein the memory cells belong to multiple semiconductor dies, and wherein the processor is configured to assign the multiple cell-groups in different respective semiconductor dies.

9. The controller according to claim 8, wherein the processor is configured to assign the multiple cell-groups in accordance with a die-specific assignment pattern of cell-groups to parity-groups.

10. The controller according to claim 1, wherein the memory cells are organized in a three-dimensional (3D) configuration in which each WL comprises memory cells of multiple different strings, and wherein the processor is configured to assign data pages of different strings to different respective parity-groups.

11. The controller according to claim 1, wherein each of the memory planes comprises multiple memory blocks, each memory block comprises a different respective set of multiple WLs, wherein the first failure mode causes the failure in all the WLs of a memory block in the single memory plane, and wherein the processor is configured to recover an entirety of the memory block using data stored in one or more memory blocks of one or more other memory plane.

12. A method, comprising:
  storing data in a multi-plane memory comprising multiple memory cells organized in multiple word lines (WLs) traversing at least two different memory planes that are accessible in parallel, wherein each WL that traverses the different memory planes and is connected to respective cell-groups of the memory cells in the different memory planes, wherein in a first failure mode, two or more cell-groups belonging to different WLs fail but only in a single memory plane, and wherein in a second failure mode, a plurality of cell-groups belonging to a single WL fail in multiple memory planes;
  assigning multiple cell-groups of the memory cells to a parity-group, such that (i) no two cell-groups in the parity-group belong to a same WL, and (ii) no two cell-groups in the parity-group belong to adjacent WLs in a same memory plane; and
  upon detecting a failure to access a cell-group in the parity-group, due to either the first failure mode or the second failure mode but not both the first and second failure modes simultaneously, recovering data stored in the cell-group using one or more remaining cell-groups in the parity-group.

13. The method according to claim 12, wherein the first failure mode occurs because of a WL-to-WL short, and the second failure mode occurs due to a leakage from the WL to a substrate on which the memory cells are disposed or due to a device selection failure.

14. The method according to claim 12, wherein the at least two memory planes comprise first and second memory planes on a same semiconductor die, and wherein failing WLs in the first and second memory planes belong to different respective sets of WLs.

15. The method according to claim 12, wherein the parity-group comprises a stripe in a redundant array of independent disks (RAID) storage scheme, and wherein recovering the data comprises recovering the data in accordance with the RAID storage scheme.

16. The method according to claim 12, wherein the memory cells comprise multi-level cells (MLC) storing multiple bits per cell, wherein each of the multiple cell-groups stores multiple data pages of different respective bit-significance, and wherein the method comprises assigning the data pages of the different bit-significance to different respective parity-groups.

17. The method according to claim 12, wherein the data stored in a given cell-group of the parity-group is protected using an Error Correction Code (ECC), and wherein detecting the failure comprises identifying a failure to decode the ECC.

18. The method according to claim 12, wherein the memory cells in each memory plane are comprised in multiple different memory blocks identified by respective block-indices, and wherein assigning the multiple cell-groups comprises assigning first and second cell-groups in corresponding memory blocks of the at least two memory planes, having a same block-index.

19. The method according to claim 12, wherein the memory cells belong to multiple semiconductor dies, and wherein assigning the multiple cell-groups comprises assigning the multiple cell-groups in different respective semiconductor dies.

20. A storage system, comprising:
  a multi-plane memory comprising multiple memory cells organized in multiple word lines (WLs) traversing at least two different memory planes that are accessible in parallel, wherein each WL that traverses the different memory planes and is connected to respective cell-groups of the memory cells in the different memory planes, wherein in a first failure mode, two or more cell-groups belonging to different WLs fail but only in a single memory plane, and wherein in a second failure mode, a plurality of cell-groups belonging to a single WL fail in multiple memory planes; and
  a controller, which is configured to assign multiple cell-groups of the memory cells to a parity-group, such that (i) no two cell-groups in the parity-group belong to a same WL, and (ii) no two cell-groups in the parity-group belong to adjacent WLs in a same memory plane, and, upon detecting a failure to access a cell-group in the parity-group, due to either the first failure mode or the second failure mode but not both the first and second failure modes simultaneously, to recover data stored in the cell-group using one or more remaining cell-groups in the parity-group.

* * * * *